United States Patent
Hanson et al.

(10) Patent No.: US 7,136,317 B1
(45) Date of Patent: Nov. 14, 2006

(54) DRAM WITH SELF-RESETTING DATA PATH FOR REDUCED POWER CONSUMPTION

(75) Inventors: David R. Hanson, Brewster, NY (US); Hoki Kim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,628

(22) Filed: Aug. 10, 2005

(51) Int. Cl.
*G11C 7/00* (2006.01)
*G11C 8/00* (2006.01)

(52) U.S. Cl. ............... 365/204; 365/203; 365/230.03
(58) Field of Classification Search ............... 365/204
See application file for complete search history.

(56) References Cited

U.S. PATENT DOCUMENTS

| | | | | |
|---|---|---|---|---|
| 5,229,967 A | * | 7/1993 | Nogle et al. | 365/208 |
| 5,959,918 A | * | 9/1999 | Arimoto | 365/205 |
| 6,295,244 B1 | * | 9/2001 | Kim et al. | 365/230.03 |
| 2005/0146957 A1 | * | 7/2005 | Lee et al. | 365/203 |

* cited by examiner

*Primary Examiner*—Son L. Mai
(74) *Attorney, Agent, or Firm*—Charles W. Peterson; H. Daniel Schnurmann

(57) ABSTRACT

A random access memory (RAM), such as a dynamic RAM (DRAM) or embedded DRAM (eDRAM) on a CMOS integrated circuit (IC) logic chip. Memory banks drive one line of a connected global data line pair to develop a difference signal on the pair. Simultaneously, a global signal monitor line discharges to develop a signal that mirrors the signal developing on one of the pair. When the global signal monitor line discharges sufficiently to indicate that the difference signal is large enough to sense, a global sense control sets a global data sense amplifier, the memory banks drive shuts off, and the global sense control initiates restoring global data line.

20 Claims, 4 Drawing Sheets

DRAM WITH SELF-RESETTING DATA PATH FOR REDUCED POWER CONSUMPTION

FIELD OF THE INVENTION

The present invention is related to reducing memory power consumption and more particularly to reducing power consumption in dynamic random access memory (DRAM) macros on integrated circuit (IC) chips.

BACKGROUND DESCRIPTION

Semiconductor technology and chip manufacturing advances have resulted in a steady decrease of chip feature size to increase on-chip circuit switching frequency (circuit performance) and the number of transistors (circuit density). Generally, all other factors being constant, the active power consumed by a given unit increases linearly with switching frequency. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most integrated circuits (ICs) are made in the well-known complementary insulated gate Field Effect Transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a resistor (R) in series with the closed switch), the other device (the PFET) is off, not conducting (ideally modeled as an open switch) and, vice versa. Thus, ideally, there is no static or DC current path in a typical CMOS circuit.

A CMOS inverter, for example, is a PFET and NFET pair that are series connected between a power supply voltage ($V_{dd}$) and ground (GND). Both are gated by the same input and both drive the same output, typically a capacitive load. The PFET pulls the output high and the NFET pulls the output low at opposite input signal states. Ideally, when the gate of a NFET is below some positive threshold voltage ($V_T$) with respect to its source, the NFET is off, i.e., the switch is open. Above $V_T$, the NFET is on conducting current, i.e., the switch is closed. Similarly, a PFET is off when its gate is above its $V_T$, i.e., less negative, and on below $V_T$. So, ideal CMOS circuits use no static or DC power and primarily consume transient power from charging and discharging capacitive loads.

Random access memories (RAMs) are well known in the art. A typical RAM has a memory array of rows (word lines) and columns (bit lines) of cell locations wherein every location is addressable and freely accessible by providing the correct corresponding address. Dynamic RAMs (DRAMs) are dense RAMs with a very small memory cell. DRAM arrays, increasingly, are being embedded in logic and included on CMOS logic chips, e.g. in on-chip, processor or microprocessor cache memory. Essentially, a DRAM cell is a capacitor for storing charge and a switch, a pass transistor (also called a pass gate or access transistor) that switches on and off to transfer charge to and from the capacitor. Data (1 bit) stored in the cell is determined by the absence or presence of charge on the storage capacitor. Since each cell has numerous leakage paths from the storage capacitor, unless it is periodically refreshed, charge stored on the storage capacitor eventually leaks off.

Each DRAM cell is read by coupling the cell's storage capacitor (through the access transistor) to a bit line, which is a larger capacitance. A signal develops on the bit line that reflects the contents of the cell. Typically, the signal is a bit line voltage difference (determined by ratio of the cell and bit line capacitances) when the cell storage capacitor voltage does not match the bit line; and no difference when the voltages match. A sense amplifier measures the resulting bit line voltage difference, and develops a fully complementary signal from the bit line signal. For a typical segmented data path, the sense amplifier drives that fully complementary signal on a global data line that may also be a complementary pair of lines, each of which is a much larger capacitance than the bit line capacitance, normally, driving one of the pair low/high with the other of the pair remaining high/low. The global data line, in turn, may be an input to a driver, a latch, etc. that passes the data contents external to the DRAM, e.g., to chip logic for an eDRAM. Writing to a cell is, essentially, the reverse, i.e., driving one of the global bit line pair low/high, coupling the driven global line to the bit line and the bit line to the cell. Consequently, charging and discharging data path capacitance in each access (read/write) can consume an appreciable amount of power, to significantly increase chip power consumption.

Thus, there is a need for reducing power in high performance DRAMs, and more particularly, for reducing power in high performance DRAMs suitable for embedded use in logic chips.

SUMMARY OF THE INVENTION

It is a purpose of the invention to improve memory power consumption; It is another purpose of the invention to reduce DRAM power; It is another purpose of the invention to reduce embedded DRAM power consumption without impacting eDRAM performance.

The present invention relates to a random access memory (RAM), such as a dynamic RAM (DRAM) or embedded DRAM (eDRAM) on a CMOS integrated circuit (IC) logic chip. Memory banks drive one line of a connected global data line pair to develop a difference signal on the pair. Simultaneously, a global signal monitor line discharges to develop a signal that mirrors the signal developing on one of the pair. When the global signal monitor line discharges sufficiently to indicate that the difference signal is large enough to sense, a global sense control sets a global data sense amplifier, the memory banks drive shuts off, and the global sense control initiates restoring global data line.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENT

Figure 1:
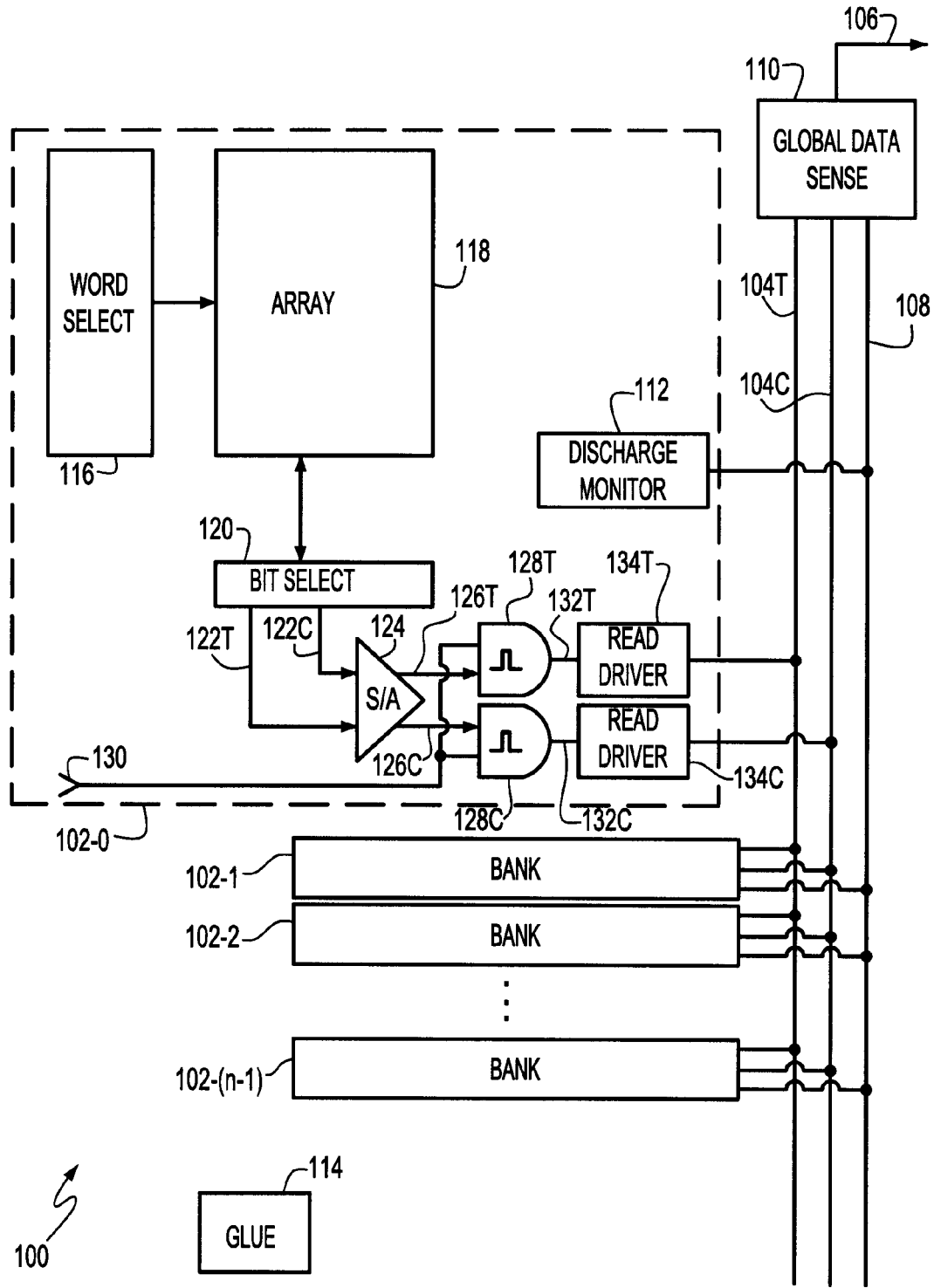
FIG. 1 shows a block diagram cross-sectional example of a single bit of a preferred embodiment embedded memory, e.g., a dynamic random access memory (DRAM) macro or embedded DRAM (eDRAM)

Turning now to the drawings and, more particularly, FIG. 1 shows a block diagram cross-sectional example of a single bit of a preferred embodiment self-resetting memory 100 for reduced power consumption, e.g., a dynamic random access memory (DRAM) macro or embedded DRAM (eDRAM). Preferably, the eDRAM 100 is formed in the insulated gate Field Effect Transistor (FET) technology known as CMOS. The preferred eDRAM 100 is organized into n identical banks 102-0, 102-1, 102-2, ..., 102-(n−1), connected to a pair of complementary global data lines, 104T, 104C. A global signal monitor line 108 develops a signal that substantially mirrors a signal on a global data line 104T or 104C. Signals on the global data line pair 104T, 104C and the global signal monitor line 108 are passed to a global data sense 110 for sensing and passing data 106 externally, e.g., to on-chip logic (not shown). A discharge monitor driver 112 pulses the global signal monitor line 108 during a read to develop a signal representative of a signal coincidentally developing on a global data line 104T, 104C. When the signal on the global signal monitor line 108 is sufficient for sensing, the global data sense and control 110 sets and latches, and the global data lines 104T, 104C begin a restore. Glue logic 114 provides local logic and control (e.g., bit and address decode and local clocks) for the embedded DRAM 100. It should be noted that although shown herein as having a global signal monitor line 108 with a global data line pair 104T, 104C, this is for example only and not intended as a limitation. A single global signal monitor line 108 may be included with a group of global data line pairs 104T, 104C, e.g., a single global signal monitor line 108 for an entire eDRAM (m pairs with an m-bit word).

In this example, each bank 102-0, 102-1, 102-2, ..., 102-(n−1) includes a word select 116 to select a row of cells (not shown) in a sub-array 118 of cells in one selected bank 102-0, 102-1, 102-2, ..., 102-(n−1). A bit select 120 selects an array column, typically a bit line connected to cells and a reference or dummy line, and couples the selected column to a complementary pair of local data lines 122T, 122C. The local data lines 122T, 122C carry the selected data signal and the reference line signal from the selected column as a difference signal to a local sense amplifier 124. So for each bank 102-0, 102-1, 102-2, ..., 102-(n−1), in this example, cells of a sub-array 118 are selected by coincidence of a row (i.e., a word line) selected by word select 116 and a column selected by the bit select 120. The local sense amplifier 124 for the selected bank 102-0, 102-1, 102-2, ..., 102-(n−1) senses the signal on the complementary pair of local data lines 122T, 122C, and provides a pair of complementary outputs 126T, 126C. Complementary sense amplifier outputs 126T, 126C each pass through an edge shaper 128T, 128C that may simply be an AND gate driving an inverting driver, for example. A read select signal 130 selectively passes complementary outputs 126T, 126C through the edge shapers 128T, 128C, to emerge as a pair of complementary intermediate signals 132T, 132C. Global data drivers 134T, 134C re-drive the pair of complementary intermediate signals 132T, 132C onto a corresponding one of the global data line pair 104T, 104C, to develop a difference signal on the global data line pair 104T, 104C.

The global signal monitor line 108 may have substantially the same capacitance as each of the global data line pair 104T, 104C with the discharge monitor driver 112 driving the global signal monitor line 108 substantially the same as the edge shapers 128T, 128C and as selected by the read select signal 130. Optionally, the capacitance on the global signal monitor line 108 may be a fraction of that one the global data line pair 104T, 104C with an equivalent ratioed drive reduction in the discharge monitor driver 112. Regardless, however, as the signal develops on one of the global data lines 104T, 104C, a substantially matching signal develops on the global signal monitor line 108 to mirror the developing signal. Thus, it may be determined when a sufficient difference voltage has developed on the global data line pair 104T, 104C by monitoring the global signal monitor line 108. Upon such determination, the global data sense 110 may complete the read access by sensing and latching the contents of the difference signal on the global data line pair 104T, 104C and, automatically terminating discharge. So, in a preferred embodiment RAM, instead of fully discharging and recharging the global data line capacitance for the full voltage, the read access automatically terminates after discharging only a fraction of the discharging global data line 104T or 104C. Since power is proportional to $CV^2$, a 30% reduction in discharge/charge voltage, for example, provides a 50% power reduction. Advantageously, read power consumed in a preferred embodiment RAM is only a fraction of that used for a full signal of prior art RAMs.

Figure 2A:
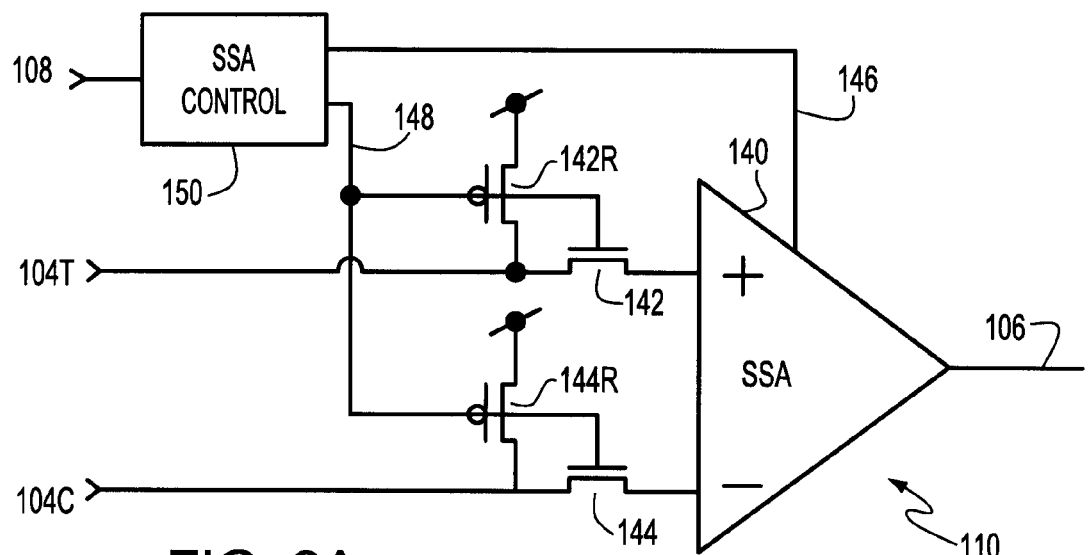
FIGS. 2A–B shows an example of a preferred embodiment sense.
Figure 2B:
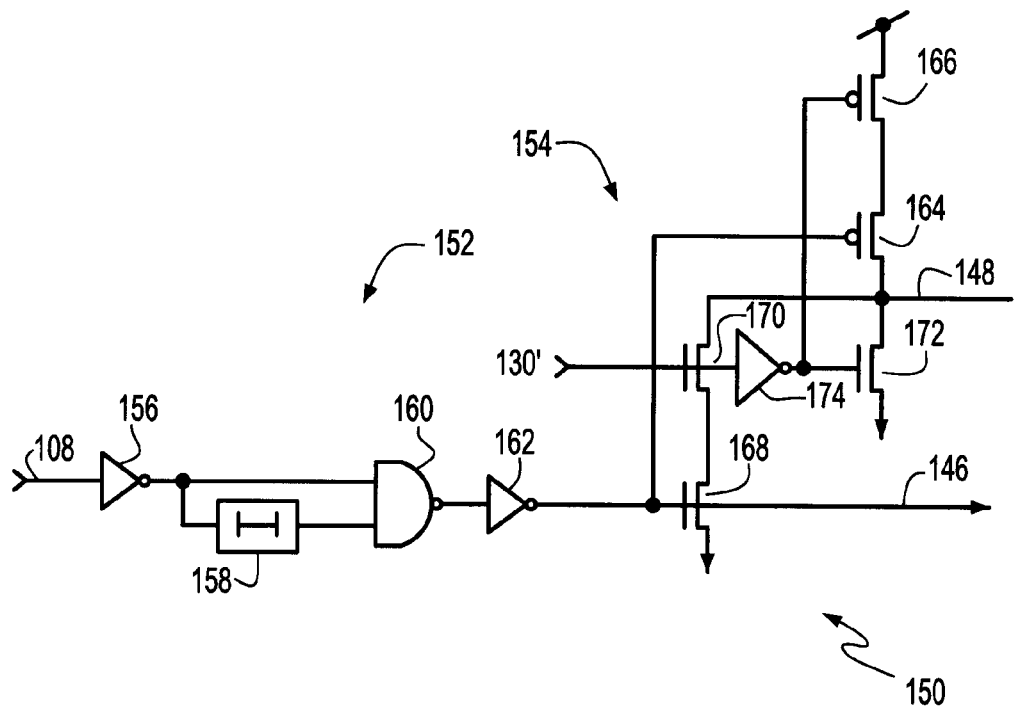

FIGS. 2A–B show an example of a preferred embodiment global data sense and control, e.g., 110 in the example of FIG. 1. As can be seen in FIG. 2A, a sense amplifier 140 selectively receives the difference signal from the global data lines 104T, 104C through a pair of pass gates 142, 144, N-type FETs (NFETs) in this example. The global signal monitor line 108 drives a global sense amp control (SSAC) circuit 150. The SSAC circuit 150 provides a sense amplifier set signal 146 to set the sense amplifier 140 after sufficient signal has developed on the global data lines 104T, 104C. The SSAC circuit 150 also provides a sense enable 148 that opens/closes the pass gates 142, 144 to couple the global data lines 104T, 104C to the sense amplifier 140. The sense enable 148 also gates pair of restore devices, P-type FETs (PFETs) 142R, 144R, to selectively float during a read, or to restore the global data lines 104T, 104C between reads. FIG. 2B shows an example of the SSAC circuit 150, which includes a pair of pulse generators 152, 154. The global signal monitor line 108 drives one of the pulse generators 152, which pulses the sense amplifier 140. A read select signal 130', timed substantially the same as read select 130 in FIG. 1, initiates a pulse from the second pulse generator 154 to turn on the pass gates (142, 144) and turn off the restore devices 142R, 144R. The pulse from the first pulse generator 152, which sets the sense amplifier 142R, terminates the pulse from the second, turning off the pass gates 142, 144 and turning on the restore devices 142R, 144R.

In this example, the first pulse generator 152 includes an inverter 156 driven by the global signal monitor line 108. The inverter 156 drives an inverting delay 158 and one input of a NAND gate 160. The inverting delay 158 may be, for example, an odd number of series connected inverters (not shown), selected for a propagation delay for the desired pulse width to set the sense amplifier 140. The inverting delay 158 drives the other input to NAND gate 160, which provides a low going pulse whenever the output of the first inverter 156 switches from a low to a high. The NAND gate 160 drives an inverter 162 that drives the global sense amplifier set signal 146. The second pulse generator 154 includes a pair of series connected PFETs 164, 166 connected between the supply ($V_{dd}$) and the sense enable 148 output. A pair of series connected NFETs 168, 170 are connected in parallel with a single NFET 172, all connected between the output and ground of the sense enable 148. An inverter 174 is connected between the gates of one of the series connected NFETs 170 and the single NFET 172, driving the gate of the single NFET 172. The read select signal 130' drives both gate of NFET 172 and the inverter 174. The sense amplifier set signal 146 drives the gate of one each of the series connected PFETs and series connected NFETs, in this example 164 and 168.

Initially, with the read select signal 130' low and the global signal monitor line 108 high, the global sense amplifier set signal 146 is low, series connected PFET 164 is on, and both series connected NFETs 168, 170 are off. The output of inverter 174 is high, so PFET 166 is off, and the single NFET 172 is on, holding the sense enable 148 low, which holds the pass gates 142, 144 open and the restore devices 142R, 144R on. When the read select signal 130' rises, NFET 170 turns off and the output of the inverter 174 falls. With the output of inverter 174 low, single NFET 172 turns off and PFET 164 turns on. With both PFETs 164, 166 on, the sense enable 148 rises turning on the pass gates 142, 144, and, simultaneously, turning off the restore devices 142R, 144R, to couple the global data lines 104T, 104C to the sense amplifier 140. When the global signal monitor line 108 falls below the switch point of the first inverter 156, the output of the first inverter 156 switches high. The high on the output of inverter 156 matches the high on the output of the inverting delay 158, and so, the output of NAND gate 160 drops. The low from the NAND gate 160 is inverted by inverter 162, which sets the sense amplifier 140, turns off PFET 164 and turns on the second series connected NFET 168, i.e. both NFETs 168, 170 are on. Having NFETs 168, 170 on, pulls the sense enable 148 low, which isolates the input to sense amplifier 140 and begins restoring the global data lines 104T, 104C. At this point, the read select signal 130' can return low, which again turns off NFET 170 and the output of inverter 174 switches to turn off PFET 166 and on single NFET 172 to clamp sense enable 148 low. Once the high on the output of first inverter 156 traverses the inverting delay 158, the output of the inverting delay 158 falls. The low on the output of the inverting delay 158 causes the output of NAND gate 160 to rise, which causes second inverter 162 to drive the sense amplifier set signal 146 low. The read ends with the global signal monitor line 108 being restored high until the next read access.

Figure 3A:
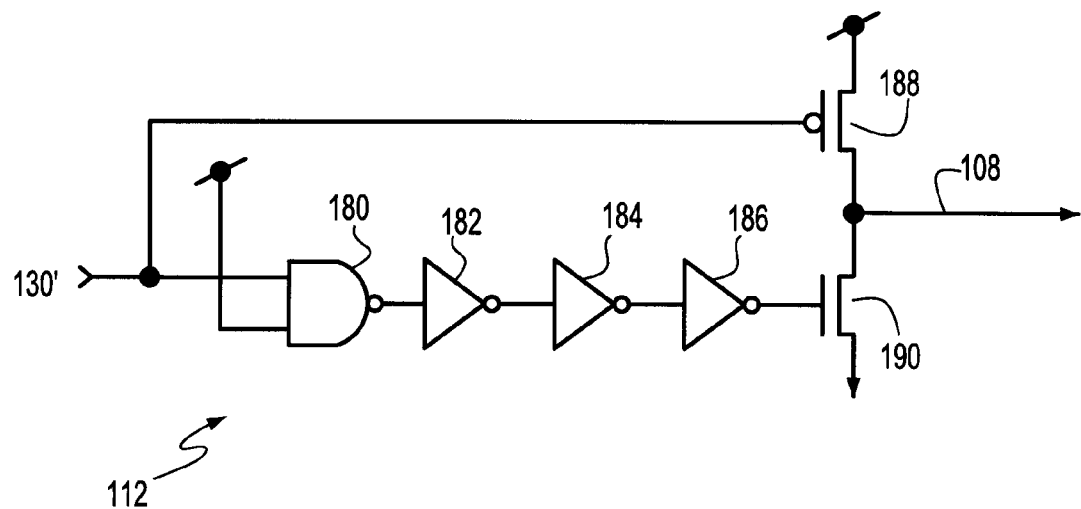
FIGS. 3A–B show examples of each of a preferred discharge monitor driver and a preferred global data driver.
Figure 3B:
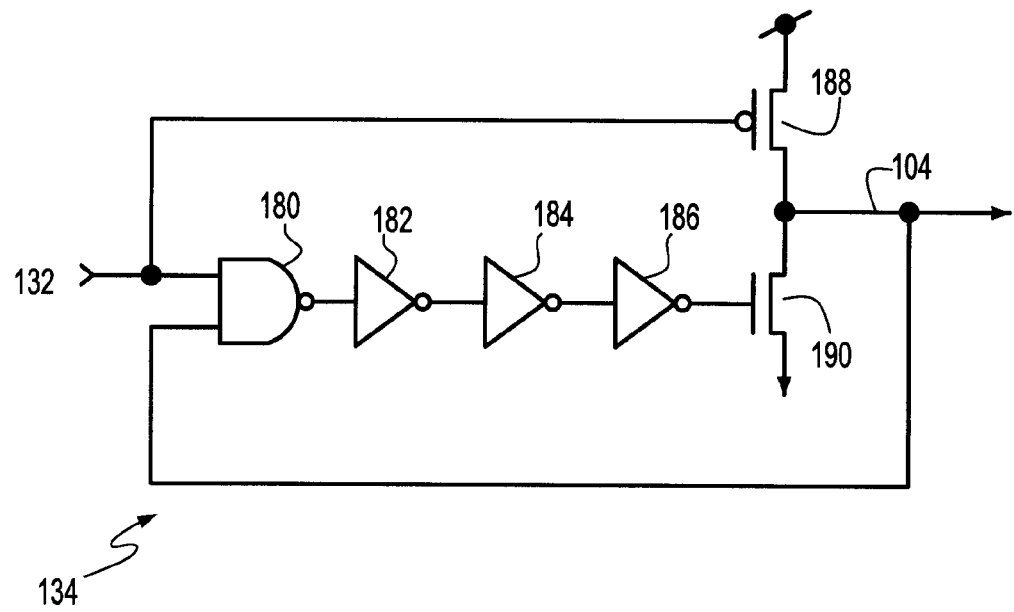

FIGS. 3A–B show examples of each of a preferred discharge monitor driver 112 and a preferred global data driver 134, which are substantially similar in this example and with like electrical elements labeled identically. Each circuit 112, 134, includes a NAND gate 180 driving three (3) series connected inverters 182, 184, 186. One input to the NAND gate 180 gates a PFET 188, that is connected source to drain between $V_{dd}$ and the respective output, 108, 104. The output of the third inverter 186 drives an NFET 190 that is connected drain to source between the respective output, 108, 104 and ground. In the preferred discharge monitor driver 112 the second input to the NAND gate 180 is tied high to $V_{dd}$. In the preferred global data driver 134 the global data line 104 output feeds back to the second input to the NAND gate 180.

Thus, in the preferred discharge monitor driver 112 the NAND gate 180 and 3 series connected inverters 182, 184, 186 act as a non-inverting delay. So, with the read select 130' low, PFET 188 is on and NFET 190 is off. When the read select 130' switches, PFET 188 turns off, and the high begins to propagate through the non-inverting delay. When the high exits the third inverter 186, NFET 190 turns on, to begin pulling the global signal monitor line 108 low. When the read select 130' returns low, the PFET 188 turns on immediately to begin pulling the global signal monitor line 108 high. Again, when the low exits the third inverter 186, NFET 190 turns off. Thus, rise and fall times can be selected for the global signal monitor line 108 by proper selection of line capacitance (load) and PFET 188, NFET 190, dimensions.

Similarly, in a preferred global data driver 134, the NAND gate 180 and 3 series connected inverters 182, 184, 186 act as a gated non-inverting delay. Prior to a read, with the read select 130 low, input 132 is low, because both edge shapers (e.g., 128T and 128C in FIG. 1) hold their respective outputs low. So, prior to a read with input 132 low, PFET 188 is on, NFET 190 is off and the global data line 104 is high. When the read select 130 switches, one edge shaper (128T or 128C) drives an output high. When 132 rises, the PFET 188 turns off, and the high begins to propagate through the non-inverting delay. When the high exits the third inverter 186, NFET 190 turns on, to begin pulling the global data line 104 low. When, the global data line falls below the switching point for NAND gate 180, the low begins to propagate through the non-inverting delay and turn off the NFET 190. Further, NFET 190 is held off until the global data line 104 is returned high, either by the input 132 being pulled low or by a respective restore device (e.g., 142R, 144R in FIG. 2A). When the input 132 is pulled low, PFET 188 turns on, immediately, to begin pulling the global data line 104 high with the respective restore device. Again, when the low exits the third inverter 186, NFET 190 turns off. Thus, global data line 104 rise and fall times can be determined by selected PFET 188, NFET 190, and restore device dimensions for the particular line capacitance.

Figure 4:
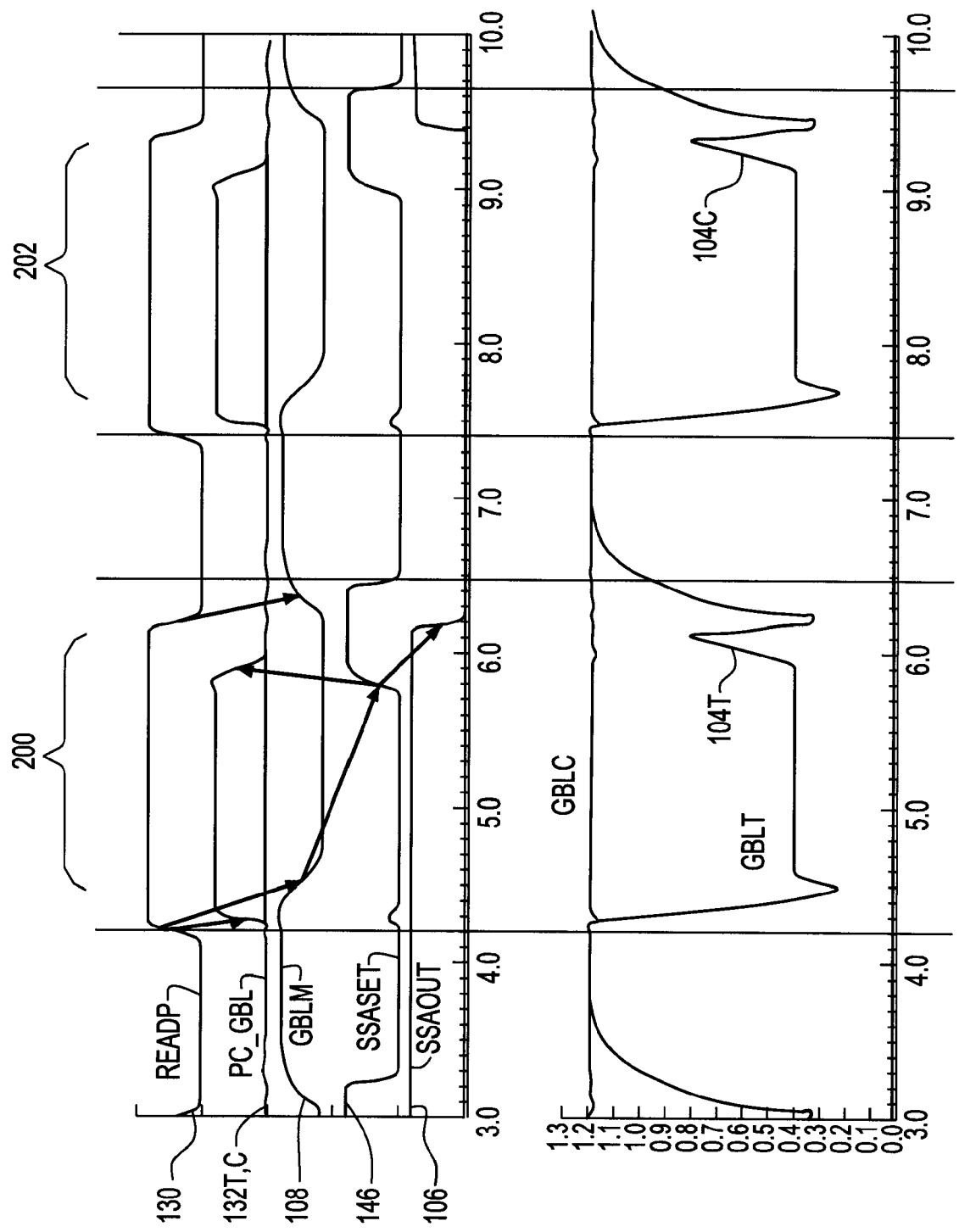
FIG. 4 shows a timing example for reading a zero ("0") followed by reading a one.

FIG. 4 shows a timing example for reading a zero ("0") in the segment labeled 200 followed by reading a one ("1") in the segment labeled 202. The read select 130 rises, which drives one of the pair of complementary intermediate signals 132T,C high. Simultaneously, both the global signal monitor line 108 and one of the global data lines 104T, 104C begin to fall. The global data line 104T or 104C falls until pulse generator 152 triggers. Thus, as can be seen from this example, the low-going global data line 104T, 104C, stops short of fully discharging line capacitance, at approximately 30% of full charge. Thus, for this single bit cross-section, read access power is approximately half that of full discharge. Further, this savings is realized for each bit of a multi-bit memory word, e.g., 128 bits. Additional savings may be realized by selecting a sense amplifier 110 with a higher sense point and adjusting the trigger point for the SSAC circuit 150. After sufficient delay, e.g., setup time for the global sense amplifier 142, the sense amplifier set signal 146 pulses the sense amplifier 142, which passes sensed data 106 out.

Advantageously, power consumption is dramatically reduced for a preferred embodiment DRAM or eDRAM by self-resetting the data path, without trading performance, density or external complexity.

While the invention has been described in terms of preferred embodiments, those skilled in the art will recognize that the invention can be practiced with modification within the spirit and scope of the appended claims.

What is claimed is:

1. A random access memory (RAM) comprising: a plurality of memory banks, each bank including a sub-array of selectable memory cells; at least one complementary global data line pair connected to said plurality of memory banks, each pair selectively developing a difference signal responsive to a selected cell in one of said plurality of memory banks; a global signal monitor line mirroring discharge of one line of a corresponding said global data line pair; and a global sense and control sensing said difference signal responsive to said discharge and restoring said corresponding global data line pair.

2. A RAM as in claim 1, wherein each of said memory banks includes at least one pair of global data drivers driving a corresponding said complementary global data line pair, and said RAM further comprises a discharge monitor driver driving said global signal monitor line.

3. A RAM as in claim 2, wherein each one of said discharge monitor driver and said pair of global data drivers comprises: a delay receiving a read select signal; a first device of a first conduction type gated by said read select signal and connected at a conduction terminal to an output; and a second device of a second conduction type receiving a delayed read select from said delay and connected at a conduction terminal to said output.

4. A RAM as in claim 3, wherein said output of each of said global data drivers is combined with said read select signal in said delay.

5. A RAM as in claim 3, wherein said RAM is a CMOS dynamic RAM (DRAM), said first device is a P-type Field Effect Transistor (PFET) and said second device is an N-type FET (NFET) and said delay comprises a NAND gate driving a plurality of series connected inverters.

6. A RAM as in claim 3, wherein said global sense and control comprises:
a global sense amplifier providing a read data output; a first pulse generator selectively coupling said difference signal from one said corresponding global data line pair to said global sense amplifier; and a second pulse generator selectively-setting said sense amp.

7. A RAM as in claim 6, wherein said first pulse generator initiates a read pulse responsive to a read select signal, said read pulse coupling said difference signal to said global sense amplifier, a set pulse from said second pulse generator terminating said read pulse and initiating resetting said corresponding global data line pair.

8. A RAM as in claim 6, wherein said RAM is a CMOS dynamic RAM (DRAM) and said global sense and control further comprises a pair of Field Effect Transistor (FET) pass gates selectively coupling said difference signal to said global sense amplifier responsive to said read pulse from said first pulse generator.

9. A CMOS DRAM as in claim 8, wherein said FET pass gates are NFETs and said global sense and control further comprises a pair of PFETs restoring said corresponding pair gated by said read pulse.

10. A CMOS integrated circuit (IC) chip including a dynamic random access memory (DRAM), said DRAM comprising: a plurality of memory banks, each bank including a sub-array of selectable DRAM cells; a plurality of global data line pairs connected to said plurality of memory banks, each of said plurality of memory banks selectively developing a difference signal on connected said global data line pairs responsive to selected cells; a plurality of global data sense amplifiers; a plurality of pairs of Field Effect Transistor (FET) pass gates, each pair of FET pass gates being connected source to drain between one global data line pair and a corresponding global data sense amplifier; at least one global signal monitor line mirroring discharge of one line of a coupled global data line pair; and at least one global sense control connected to a corresponding global monitor line and having a read select input, a read pulse output and a set pulse output, the gates of each pair of FET pass gates being connected to a corresponding said read pulse output, a set input on each data sense amplifier being connected to a corresponding set pulse output, said global sense control providing a read pulse responsive to a read select input signal and a set pulse responsive to monitored said discharge.

11. A CMOS IC chip as in claim 10, wherein each of said memory banks includes a corresponding pair of global data drivers connected to each of said connected global data line pairs.

12. A CMOS IC chip as in claim 11, further comprising a discharge monitor driver driving each said at least one global signal monitor line.

13. A CMOS IC chip as in claim 12, wherein each one of said discharge monitor driver and said pair of global data drivers comprises: a delay receiving a read select signal; a P-type FET (PFET) gated by a read select and the drain of said PFET connected to an output; and an N-type FET (NFET), the drain of said NFET connected to said output and a delayed read select from said delay gating said NFET.

14. A CMOS IC chip as in claim 13, wherein said output of each of said global data drivers is combined with said read select signal in said delay.

15. A CMOS IC chip as in claim 12, wherein, said pairs of FET pass gates are N-type FET (NFET) pass gates, each of said global data line pairs includes a pair of P-type FET (PFET) restore devices, the gates of each pair of PFET restore devices being connected to the gates of a corresponding pair of NFET pass gates and said global sense control comprises: a first pulse generator connected to the gates of one said pair of PFET restore devices and selectively providing said read pulse; and a second pulse generator selective providing said set pulse.

16. A CMOS IC chip as in claim 15, wherein said first pulse generator initiates said read pulse responsive to said read select signal, said set pulse terminating said read pulse.

17. A CMOS IC chip as in claim 16, wherein said CMOS IC is a logic chip and said DRAM is an embedded DRAM in said logic chip, data outputs from said plurality of global sense amplifiers being provided to chip logic.

18. A CMOS integrated circuit (IC) logic chip including an embedded dynamic random access memory (eDRAM), said eDRAM comprising: a plurality of memory banks, each bank including a sub-array of selectable DRAM cells and at least one local sense amplifier sensing selected cell contents and driving a pair of global data drivers; a plurality of global data line pairs, each connected to a respective said pair of global data drivers in each connected one of said plurality of memory banks, each of said connected pair of global data drivers selectively developing a difference signal on a connected said global data line pair; a plurality of pairs of N-type Field Effect Transistor (NFET) pass gates, each pair of NFET pass gates being connected at a source/drain terminal to one line of a global data line pair; a plurality of P-type FET (PFET) restore devices, the drain of each of said PFET restore devices being connected to one line of one said global data line pair; a plurality of global data sense amplifiers providing a data output, each connected to a corresponding one of said plurality of pairs of NFET pass gates; at least one global signal monitor line; a discharge monitor driver driving each said global signal monitor line, each driven said global signal monitor line mirroring discharge of one line of a coupled global data line pair; and at least one global sense control connected to a corresponding global monitor line and having a read select input, a read pulse output and a set pulse output, the gates of each pair of NFET pass gates and of a pair of PFET restore devices being connected to a corresponding said read pulse output, a set input on each data sense amplifier being connected to a corresponding set pulse output, said global sense control providing a read pulse responsive to a read select input signal and a set pulse responsive to monitored said discharge.

19. A CMOS IC logic chip as in claim 18, wherein each one of said discharge monitor driver and said global data drivers comprises: a delay receiving a read select signal; a P-type FET (PFET) gated by a read select and the drain of said PFET connected to an output; and an N-type FET (NFET), the drain of said NFET connected to said output and a delayed read select from said delay gating said NFET, said output of each of said global data drivers being combined with said read select signal in said delay.

20. A CMOS IC logic chip as in claim 12, wherein, said global sense control comprises: a first pulse generator selectively providing said read pulse responsive to said read select signal, said read pulse turning off a connected said each pair of PFET restore devices; and a second pulse generator selective providing said set pulse, said set pulse terminating said read pulse, said connected pair of PFET restore devices turning on upon termination of said read pulse.

* * * * *